(12) United States Patent
Fang et al.

(10) Patent No.: US 9,678,140 B2
(45) Date of Patent: Jun. 13, 2017

(54) ULTRA FAST TRANSISTOR THRESHOLD VOLTAGE EXTRACTION

(71) Applicant: TEXAS INSTRUMENTS INCORPORATED, Dallas, TX (US)

(72) Inventors: Ming Fang, Plano, TX (US); Faheem Zain Mohamedi, Arlington, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 309 days.

(21) Appl. No.: 14/327,337

(22) Filed: Jul. 9, 2014

(65) Prior Publication Data
US 2015/0070045 A1 Mar. 12, 2015

Related U.S. Application Data

(60) Provisional application No. 61/875,938, filed on Sep. 10, 2013.

(51) Int. Cl.
*G01R 31/26* (2014.01)

(52) U.S. Cl.
CPC ............... *G01R 31/2621* (2013.01)

(58) Field of Classification Search
None
See application file for complete search history.

(56) References Cited

U.S. PATENT DOCUMENTS

| | | | |
|---|---|---|---|
| 2005/0095728 A1* | 5/2005 | Hillard | G01R 31/2648 438/14 |
| 2005/0193013 A1* | 9/2005 | Yamashita | H01L 22/14 |
| 2006/0148111 A1* | 7/2006 | Jang | G01R 31/2621 438/14 |
| 2011/0102091 A1* | 5/2011 | Yeric | G01K 7/32 331/57 |

(Continued)

OTHER PUBLICATIONS

G. A. Du, D. S. Ang, Z. Q. Teo and Y. Z. Hu, "Ultrafast Measurement on NBTI," in IEEE Electron Device Letters, vol. 30, No. 3, pp. 275-277, Mar. 2009.*

(Continued)

*Primary Examiner* — Melissa Koval
*Assistant Examiner* — Felicia Farrow
(74) *Attorney, Agent, or Firm* — Tuenlap D. Chan; Charles A. Brill; Frank D. Cimino

(57) ABSTRACT

A method for performing a semiconductor parametric test comprising performing a full voltage sweep for a first component on a first semiconductor wafer to determine a first value of an electrical characterization parameter for the first component, wherein the full voltage sweep comprises a range between about a minimum input voltage level of the first component and about a maximum input voltage level of the first component, determining a smart sensing window (SSW) for a plurality of subsequent components on the first semiconductor wafer according to the first value, wherein the SSW comprises a range comprising a portion of the full voltage sweep range, performing a partial voltage sweep in (Continued)

the SSW for each of the subsequent components to determine a second value of the electrical characterization parameter for each of the subsequent semiconductor components, and adapting the SSW for at least some of the subsequent components.

20 Claims, 6 Drawing Sheets

(56) References Cited

U.S. PATENT DOCUMENTS

| 2012/0049881 | A1* | 3/2012 | Johnson | G01R 31/2894 324/762.01 |
| 2012/0074981 | A1* | 3/2012 | Luo | G01R 31/2621 324/762.09 |
| 2012/0187975 | A1* | 7/2012 | Koh | G01R 31/2621 324/762.01 |

OTHER PUBLICATIONS

J. P. Campbell, K. P. Cheung, J. S. Suehle and a. Oates, "The fast initial threshold voltage shift: NBTI or high-field stress," 2008 IEEE International Reliability Physics Symposium, Phoenix, AZ, 2008, pp. 72-78.*

* cited by examiner

| COMPONENT TYPE | THRESHOLD VOLTAGE TYPE | FULL SWEEP THRESHOLD VOLTAGE TEST (V) | SSW THRESHOLD VOLTAGE TEST (V) | DELTA (mv) |
|---|---|---|---|---|
| 5V NMOS | SATURATED | 0.6018 | 0.6018 | 0 |
| 20V LDMOS | LINEAR | 1.1330 | 1.1330 | 0 |
| 33V DRAIN EXTENDED NMOS | LINEAR | 1.4670 | 1.4670 | 0 |
| 7V NMOS | LINEAR | 0.5544 | 0.5545 | 0.1 |
| 3V LOW THRESHOLD VOLTAGE PMOS | LINEAR | -0.2405 | -0.2404 | 0.1 |

ULTRA FAST TRANSISTOR THRESHOLD VOLTAGE EXTRACTION

CROSS-REFERENCE TO RELATED APPLICATION

The present application claims priority to U.S. Provisional Patent Application 61/875,938, filed Sep. 10, 2013 by Ming Fang et. al., and titled "NOVEL ULTRA FAST TRANSISTOR THRESHOLD VOLTAGE MEASUREMENT AND EXTRACTION METHOD," which is incorporated herein by reference as if reproduced in its entirety.

BACKGROUND

Semiconductor device fabrication is a process used to produce integrated circuits (ICs) that are present in electrical and/or electronic devices. The fabrication process may include multiple sequences of photolithographic and/or chemical processing steps during which electronic circuits may be gradually generated on a wafer of semiconducting material (e.g., Silicon). After the fabrication process is completed, various types of tests may be performed to determine that the electronic circuits fabricated on the wafer meet the designed performance (e.g., electrical properties). Manufacturing and/or production testing may become more important and complex as semiconductor devices become more compact in size and/or more advanced in functionality. As such, manufacturing and/or production test time may also increase, and thus the cost of testing may become a significant factor in manufacturing costs.

SUMMARY

A transistor threshold voltage extraction scheme is disclosed herein. In one embodiment, a method for performing a semiconductor parametric test at a test engine includes performing a full voltage sweep for a first component on a semiconductor wafer to determine a first value of an electrical characterization parameter for the first component. The full voltage sweep comprises a range between about a minimum input voltage level of the first component and about a maximum input voltage level of the first component. The method further includes determining a smart sensing window (SSW) for a plurality of subsequent components on the semiconductor wafer according to the first value. The SSW comprises a range comprising a portion of the full voltage sweep range. The method further includes performing a partial voltage sweep in the SSW for each of the subsequent components to determine a second value of the electrical characterization parameter for each of the subsequent semiconductor components and adapting the SSW for at least some of the subsequent components.

In another embodiment, a non-transitory, computer-readable storage device comprising computer executable instructions that, when executed by a test engine, cause the test engine to determine a SSW for a voltage sweep. To determine the SSW, the instructions further cause the test engine to send a first command to increment a voltage source in first increments spanning a full input voltage range of a first component on a semiconductor wafer and read first current measurements of the first component. The current measurements correspond to the first increments. To determine the SSW, the instructions further cause the test engine to compute a first value associated with an electrical characterization parameter for the first component from the first current measurements and determine a range for the SSW according to the first value such that the SSW range comprises a portion of the full voltage range near the first value. The instructions further cause the test engine to send a second command to increment the voltage source in second increments spanning the SSW range. The instructions further cause the test engine to read second current measurements of a second component on the semiconductor wafer. The second current measurements correspond to the second increments. The instructions further cause the test engine to compute a second value associated with the electrical characterization parameter for the second component according to the second current measurements.

In yet another embodiment, an apparatus includes a first interface configured to communicate with an input voltage source and a second interface configured to communicate with a current measuring instrument. The input voltage source couples to a plurality of transistors on a first semiconductor wafer. Each transistor comprises a gate, a source, and a drain. The current measuring instrument couples to the transistors. The apparatus further includes a test engine coupled to the first interface and the second interface. The test engine is configured to configure, via the first interface, the voltage source to connect between the gate and the source of a first of the transistors and sweep in a full voltage range in voltage increments. The full voltage range is between about a minimum gate voltage of the transistors and about a pre-determined stop gate voltage of the transistors. The test engine is further configured to read, via the second interface, drain current measurements of the first transistor, wherein the current measurements correspond to the voltage increments. The test engine is further configured to compute transconductances for the first transistor from the current measurements. The transconductances correspond to the voltage increments. The test engine is further configured to determine a first voltage level that provides a maximum transconductance for the first transistor. The test engine is further configured to determine a SSW range according to the voltage level. The SSW range comprises a portion of the full voltage range near the first voltage level. The test engine is further configured to configure, via the first interface, the voltage source to connect between the gate and the source of a second of the transistors and sweep in the SSW range and determine a threshold voltage for the second transistor in the SSW range.

BRIEF DESCRIPTION OF THE DRAWINGS

For a detailed description of exemplary embodiments of the invention, reference will now be made to the accompanying drawings in which.

DETAILED DESCRIPTION

Figure 1:
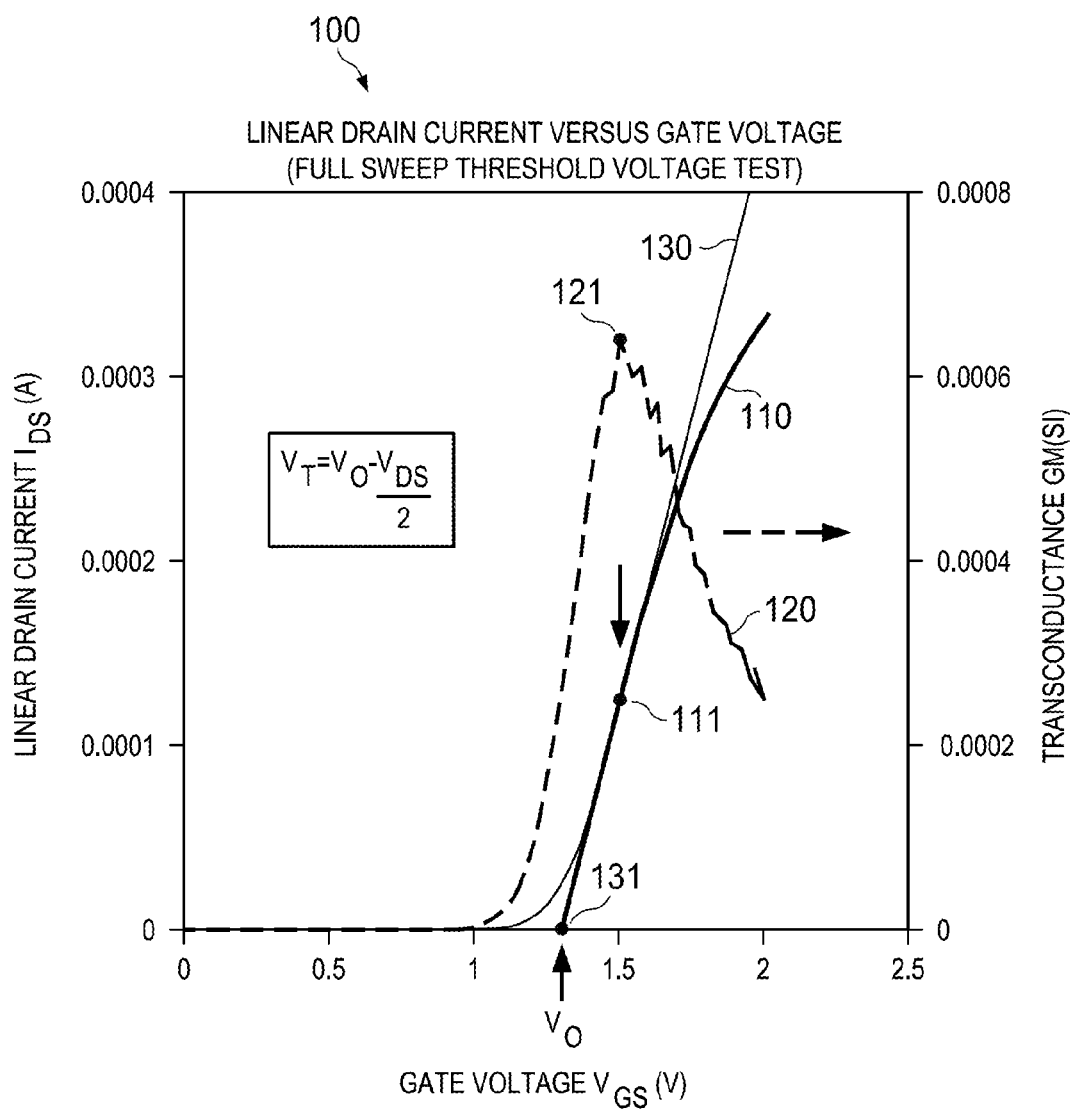
FIG. 1 is a graph showing plots of drain current and transconductance as a function of gate voltage for a transistor in a full sweep threshold voltage test in accordance with various embodiments.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Semiconductor devices may be produced and/or fabricated in large batches on a semiconductor wafer. The wafer may be divided into a plurality of dies (e.g., a block of semiconductor material), where a given functional circuit or device may be fabricated on each die. Semiconductor manufacturers may employ various test equipment (e.g., testers) to perform various types of tests on the fabricated semiconductor devices for engineering characterization and/or production validation. The tests may be performed at various phases during the fabrication process and/or subsequent to the fabrication to determine quality, reliability, and/or performance for each device. Manufacturing and/or production tests may include thermal characterization, electrical characterization, etc. The performance of each device may vary, for example, due to variations in the fabrication process. As such, device performance may vary from die-to-die across a wafer and/or from wafer-to-wafer. Thus, manufacturers may test each device on a wafer or at least a substantially large number of device samples on a wafer after fabrication to determine operational functionalities and/or performance with respect to design specifications.

Some examples of active semiconductor components may include transistors, diodes, analog ICs, digital ICs, etc. One of the frequently tested electrical characterization parameters for such active semiconductor components may be the component's threshold voltage. In an embodiment of a transistor comprising a gate, a source, and a drain, a threshold voltage may refer to a gate voltage level (e.g., voltage between the gate and the source) at which a conducting channel begins to connect between the source and the drain such that a significant amount of current may flow between the source and the drain. The threshold voltage may be determined by sweeping the gate voltage in a full gate voltage range in a number of fixed increments (e.g., about 100 increments). For each increment of the gate voltage, the tester may measure drain to source current and compute transconductance. After completing all increments, the tester may determine a maximum transconductance and may compute a threshold voltage according to the maximum transconductance. The sweeping of the gate voltage may consume a substantial amount of time (e.g., about 25 percent (%) of total parametric test time). The testing capacity (e.g., number of devices per unit time) of a tester may be determined by the time duration for each test, and may in turn determine the productivity and manufacturing cost. As such, more efficient testing methodologies may reduce the test time, and thus may reduce manufacturing costs.

FIG. 1 is a graph 100 showing plots of drain current and transconductance as a function of gate voltage for a transistor in a full sweep threshold voltage test in accordance with various embodiments. For example, the transistor may be a metal oxide semiconductor field effect transistor (MOSFET) comprising a source, a drain, a gate, and a substrate. In graph 100, the x-axis represents gate voltages $V_{GS}$ in units of Volts (V), the y-axis on the left side of the graph 100 represents linear drain current $I_{DS}$ in units of Amperes (A), and the y-axis on the right side of the graph 100 represents transconductance $G_M$ in units of Siemens (SI). In the full sweep threshold voltage test, the source and the substrate of the transistor may be grounded and a constant small voltage (e.g., bias voltage of about 0.1 V) may be applied between the drain and the source such that the transistor may operate near a linear region in which the drain current $I_{DS}$ may vary linearly with gate voltages $V_{GS}$ between the gate and the source. The full sweep threshold voltage test may determine a threshold voltage $V_T$ for the transistor by applying a variable voltage across the gate and the source in incremental steps and measuring drain current $I_{DS}$ at each gate voltage $V_{GS}$ increment. For example, the variable voltage may sweep through a full gate voltage range from a minimum gate voltage $V_{GS\_min}$ (e.g., about 0 V) to a maximum gate voltage $V_{GS\_max}$ (e.g., about 2 V) in a number of fixed steps (e.g., about 100 steps of 0.02 V). It should be noted that the gate voltage range and/or the threshold voltage may vary for different types of semiconductor devices (e.g., types of oxide, gate oxide thickness, impurities, doping, etc.).

The illustrative curve 110 represents drain current $I_{DS}$ in response to gate voltage $V_{GS}$, where a current measurement may be taken across the drain and the source for each level of $V_{GS}$. The curve 120 represents transconductance $G_M$ in response to gate voltage $V_{GS}$, where a transconductance $G_M$ may be computed from the drain current $I_{DS}$ measurement and the gate voltage $V_{GS}$ for each level of $V_{GS}$. The transconductance $G_M$ of a transistor may be defined as a derivative of drain current $I_{DS}$ with respect to gate voltages $V_{GS}$ at a constant drain voltage $V_{DS}$ and may be computed as shown below:

$$G_M = \frac{\Delta I_{DS}}{\Delta V_{GS}} \quad (1)$$

where $\Delta I_{DS}$ may represent a change in the drain current $I_{DS}$ and $\Delta V_{GS}$ may represent a change in the gate voltage $V_{GS}$.

After generating the transconductance $G_M$ versus gate voltage $V_{GS}$ curve 120, a maximum transconductance $G_{M\_max}$ may be determined by searching for a peak (e.g., at a point 121) in the curve 120. After determining the peak point 121, a straight line may be projected from the point 121 towards the drain current $I_{DS}$ versus gate voltage $V_{GS}$ curve 110 to intercept the curve 110 at a point 111. The point 111 may correspond to a point with a maximum slope $$\left(e.g., G_M = \frac{\Delta I_{DS}}{\Delta V_{GS}}\right)$$

on the curve 110.

The line 130 represents a tangential line to the curve 110 at the maximum slope point (e.g., point 111). By linear extrapolation, the line 130 may be extended towards the gate voltage axis (e.g., x-axis) to intercept the gate voltage axis at a point 131, where the gate voltage at the point 131 may be denoted as $V_0$. The threshold voltage $V_T$ for the transistor may be computed as shown below:

$$V_T = V_0 - \frac{V_{DS}}{2} \qquad (2)$$

where $V_{DS}$ may represent the drain to source voltage.

As shown in graph 100, the full sweep threshold voltage test may be employed for extracting a threshold voltage $V_T$ for a transistor, where a variable voltage may be applied across the gate and the source of the transistor in incremental steps (e.g., about 100 steps). It should be noted that the sweeping of the gate voltages $V_{GS}$ (e.g., number of voltage increments) in a threshold voltage extraction test may contribute to a major portion of wafer test time (e.g., about 25% of total parametric test time depending on device types).

Embodiments of the threshold voltage extraction mechanism disclosed herein include a smart sensing window (SSW) threshold voltage test, which may comprise a plurality of test phases, such as a SSW learning phase, a SSW application phase, and a SSW recovery phase. The SSW threshold voltage test may begin with a SSW learning phase. In the SSW learning phase, the SSW threshold voltage test may select one (or more) of the dies on a wafer as a learning site. The SSW threshold voltage test may apply a full sweep threshold voltage test to a component at the learning site to determine a gate voltage that provides a maximum transconductance for that particular component. At the end of the SSW learning phase, the SSW threshold voltage test may determine a substantially small range of gate voltages (e.g., SSW range) near the gate voltage that provides the maximum transconductance and may apply the SSW for a next die on the wafer.

In the SSW application phase, the SSW threshold voltage test may determine threshold voltages at subsequent dies on the wafer by sweeping gate voltages in the SSW range. In an embodiment, the SSW threshold voltage test may adjust and/or adapt the SSW range at each die and may apply the updated SSW range when testing a next die (e.g., sweeping gate voltages in the updated SSW range). The SSW threshold voltage test may enter the SSW recovery phase when the SSW threshold voltage test fails to determine a threshold voltage for one of the subsequent dies. In the SSW recovery phase, the SSW threshold voltage test may perform a portion of a full sweep threshold test or another full sweep threshold voltage test and may reset the SSW range according to the full sweep threshold voltage test. In an embodiment, the SSW threshold voltage test may continue to operate in the SSW application phase (e.g., applying the same SSW) while transitioning from one wafer to another wafer until a failure occurs in which the SSW threshold voltage test may transition to the SSW recovery phase. The disclosed SSW threshold voltage test may be suitable for any electrical characterization parametric tests that employ voltage sweeping and/or current sweeping and may be applied in any electrical testing of analog devices and/or digital devices. By determining a SSW range (e.g., in the neighborhood of a maximum transconductance) and sweeping gate voltages in the SSW range when determining threshold voltages, the disclosed SSW threshold voltage test may reduce threshold voltage test time by a substantial amount (e.g., about 70%) when compared to a full sweep threshold voltage test, and thus may reduce the manufacturing cost significantly.

Figure 2:
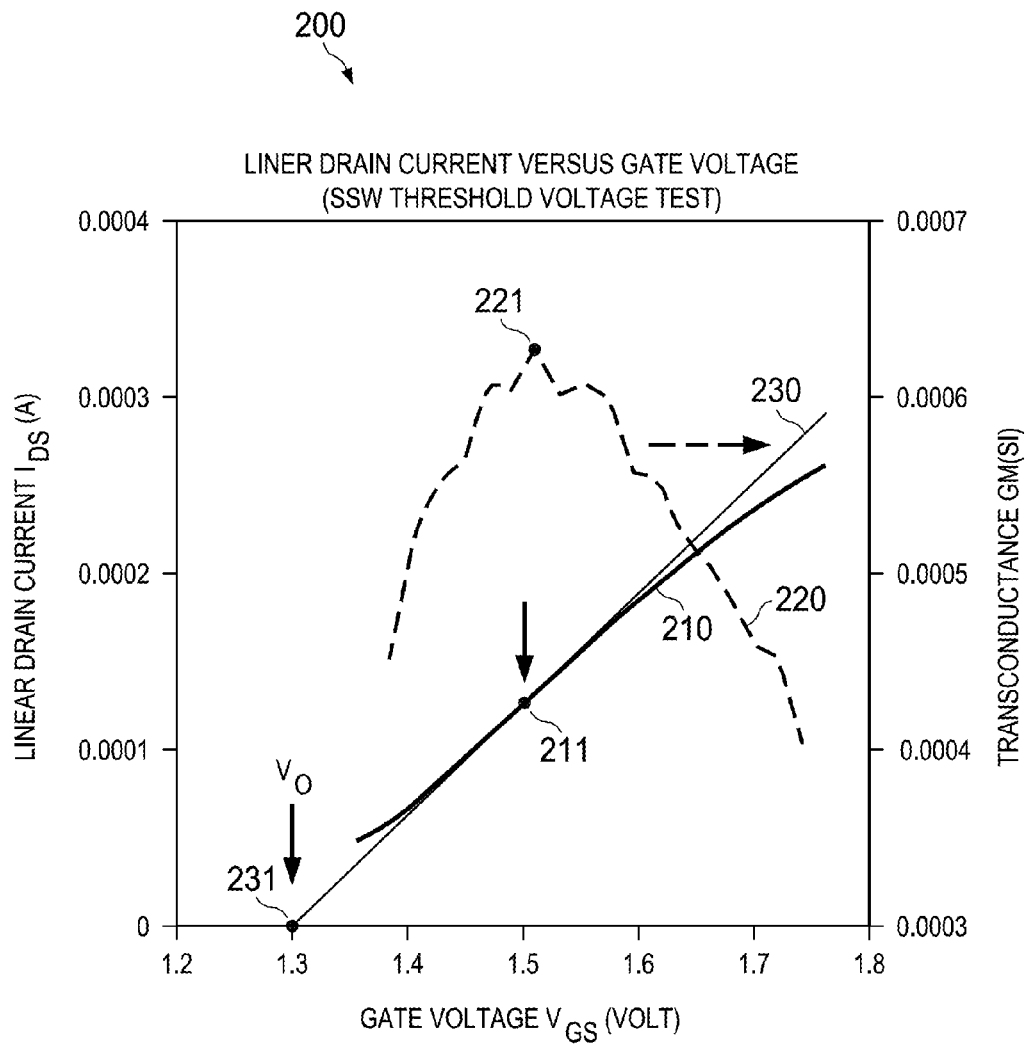
FIG. 2 is a graph showing plots of drain current and transconductance as a function of gate voltage for a transistor in a SSW threshold voltage test in accordance with various embodiments.

FIG. 2 is a graph 200 showing drain current and transconductance as a function of gate voltage for a transistor in a SSW threshold voltage test in accordance with various embodiments. For example, the transistor may be a MOSFET substantially similar to the MOSFET employed in the full sweep voltage test described with respect to graph 100. In graph 200, the x-axis represents gate voltages $V_{GS}$ in units of V, the y-axis on the left side of the graph 200 represents linear drain current $I_{DS}$ in units of A, and the y-axis on the right side of the graph 200 represents transconductance $G_M$ in units of SI. The SSW threshold voltage test may comprise a SSW learning phase, a SSW application phase, and a SSW recovery phase. For example, a semiconductor wafer may comprise a plurality of dies (e.g., about seventy dies), where each die may comprise a set of identical components and/or circuits. The SSW threshold voltage test may begin with selecting one of the dies as a learning site for determining a SSW and may apply the SSW for testing subsequent dies on the wafer.

In an embodiment of a SSW learning phase, the SSW threshold voltage test may select a die on a wafer as a learning site and may employ substantially similar mechanisms as in the full sweep threshold voltage test described with respect to graph 100 to determine a gate voltage $V_{GS\_Gmax}$ that provides a maximum transconductance at the learning site. After determining the gate voltage $V_{GS\_Gmax}$ for the learning site, the SSW threshold voltage test may select a range of gate voltages near the gate voltage $V_{GS\_Gmax}$. For example, the SSW threshold voltage test may configure the SSW such that the SSW may be centered at about the gate voltage $V_{Gs\_Gmax}$ and may span a substantially small range (e.g., about plus or minus 0.3 V from $V_{GS\_Gmax}$) that is sufficiently wide enough to account for process variations and/or other measurement variations (e.g., for safe guarding). It should be noted that the SSW range may be configured according to the characteristics of the component under test and/or a particular fabrication process. In addition, the positioning of the SSW and/or the safe guard range may be alternatively configured as determined by a person of ordinary skill in the art to achieve the same functionalities.

In an embodiment of a SSW application phase, the SSW threshold voltage test may determine threshold voltages for subsequent dies on the wafer or subsequent wafers by sweeping voltages in the SSW determined from a SSW learning phase. The SSW threshold voltage test may employ substantially similar mechanisms as in the full sweep threshold voltage test described with respect to graph 100, but may sweep gate voltages in the SSW range instead of the full sweep voltage range. The smaller SSW range (e.g., about 0.6 V in span) may enable the SSW threshold voltage test to be performed in a substantially small amount of test time, and thus may provide significant savings in manufacturing cost.

The curve 210 may represent drain current $I_{DS}$ in response to gate voltage $V_{GS}$ taken during a SSW application phase, where a current measurement may be taken across the drain and the source for each level of $V_{GS}$ in a SSW, for example, between about 1.3 V to about 1.8 V with about 14 incremental steps instead of between about zero V to about two V with about 100 incremental steps in a full sweep threshold voltage test.

The curve 220 may represent transconductance $G_M$ in response to gate voltage $V_{GS}$, where a transconductance $G_M$ may be computed from the drain current $I_{DS}$ and the gate voltages $V_{GS}$ for each level of $V_{GS}$ in the SSW. The transconductance $G_M$ may be computed by employing equation (1) as described herein above. Point 221 may represent a point on the curve 220 with a peak value (e.g., maximum transconductance). A line may be projected from point 221 towards the $I_{DS}$ versus $V_{GS}$ curve 210 intercepting curve 210 at a point 211. The point 211 may correspond to a point on the curve 210 with a maximum slope.

The line 230 may represent a tangential line to the curve 210 at the point 211. By linear extrapolation, the line 230 may be extended towards the gate voltage axis (e.g., x-axis) and may intercept the gate voltage axis at a point 231, denoted as $V_0$ in graph 200. A threshold voltage $V_T$ may be computed for the transistor by employing equation (2) as described herein above. As shown, the SSW threshold voltage test may determine threshold voltages for each subsequent die by sweeping gate voltages in a substantially smaller voltage range. In some embodiments, the SSW threshold voltage test may continue to operate in the SSW application phase and may adapt the SSW to each die, discussed more fully below.

Figure 3:
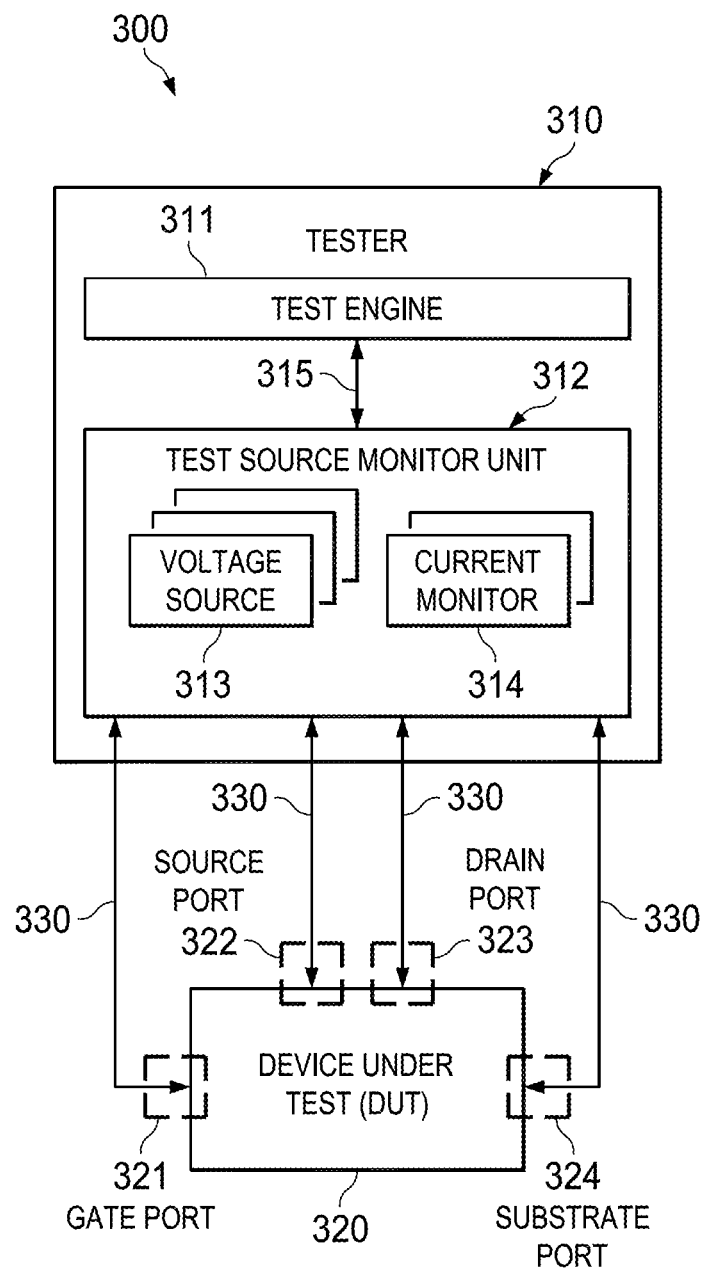
FIG. 3 shows a block diagram of a test system usable to perform an SSW threshold voltage in accordance with various embodiments.

FIG. 3 shows a block diagram of a test system 300 usable to perform an SSW threshold voltage test in accordance with various embodiments. The test system 300 may be suitable for performing any types of threshold voltage test that employs a sweeping voltage. The test system 300 may comprise a tester 310 usable to test a device under test (DUT) 320. The tester 310 and the DUT 320 may be connected via a plurality of analog connections 330, which may be any physical links configured to carry analog signals (e.g., voltage signals). The DUT 320 may be any semiconductor component, such as a p-channel metal oxide semiconductor (PMOS), an n-channel MOS (NMOS), a laterally diffused-MOS (LD-MOS), a low threshold voltage PMOS, a drain extended PMOS, a drain extended NMOS, etc. For example, the DUT 320 may be a MOSFET device comprising a gate port 321, a source port 322, a drain port 323, and a substrate port 324. The DUT 320 may reside on a die of a semiconductor wafer and may be a part of an analog device, a digital device, and/or mixed signal device.

The tester 310 may comprise a test engine 311 and a test source/monitor unit 312. The test engine 311 may be connected to the test source/monitor unit 312 via a connection 315. The connections 315 may be any physical links configured to transport digital commands and/or data. For example, the connections 315 may comprise a general purpose interface bus (GPIB), a serial peripheral interface (SPI), a universal serial bus (USB) interface, test circuits, etc.

The test engine 311 is any device configured to control the test source monitor unit 312 and/or retrieve measurements from the test source/monitor unit 312. For example, the test engine 311 is a processor, a computer workstation, or any other programmable or non-programmable device configured to execute a test program for performing a threshold voltage test. The test source/monitor unit 312 may comprise a plurality of sub-units, which may provide power and/or current to the DUT 320 and/or monitor power and/or current at the DUT 320. For example, the test source/monitor unit 312 may comprise one or more voltage sources 313 and/or current monitors 314. The voltage sources 313 may be any devices configured to generate a substantially high precision (e.g., in millivolts (mVs)) linear ramp voltage signal with a constant step, a selectable constant voltage signal, and/or a ground signal (e.g., 0 V). For example, the voltage sources 313 may include signal generators, function generators, or any other circuit element suitable for generating voltages for a semiconductor component and/or device. The current monitors 314 may be any device and/or measuring instrument configured to measure current with a substantially high precision (e.g., in milliamps (mA)). For example, the current monitors 314 may include one or more amp meters, multimeters, or any other circuit element suitable for measuring current in a semiconductor component and/or device. In some embodiments, the test source/monitor unit 312 may further comprise one or more current sources and/or one or more voltage monitors, for example, for current sweep test and/or voltage monitoring.

In an embodiment, the test engine 311 may be configured to perform a threshold voltage test for a particular die (e.g., DUT 320) on a wafer. The test engine 311 may determine a full sweep voltage range for a gate voltage, for example, according to an input gate voltage range for a specific type of components on the wafer. The test engine 311 may send one or more commands via the connection 315 to the test source/monitor unit 312. For example, the test engine 311 may configure a first of the voltage sources 313 to provide a ground source to the source port 322 and the substrate port 324 of the DUT 320. The test engine 311 may configure a second of the voltage sources 313 to provide a constant voltage signal (e.g., about 0.1 V) to the drain port 323 of the DUT 320. The test engine 311 may configure a third of the voltage sources 313 to provide a linear ramp voltage signal to the gate port 321 of the DUT 320. The test engine 311 may configure one of the current monitors 314 to measure current between the drain port 323 and the source port 322. For example, the linear ramp voltage may range from a minimum gate voltage of the DUT 320 to a pre-determined stop gate voltage (e.g., device and/or application dependent) of the DUT 320 (e.g., a full voltage) and may increment in a predetermined number of steps and/or voltage increments. The test engine 311 may concurrently retrieve current readings from the current monitor 314 via connection 315 while the linear ramp voltage is being generated, for example, a current reading per voltage step increment. The test engine 311 may also compute a transconductance value for each voltage step.

After collecting current readings and computing transconductances for all voltage steps in the full sweep voltage range, the test engine 311 may generate plots for drain current in response to gate voltage and transconductance in response to gate voltage from the current readings and the computed transconductances. The test engine 311 may determine a maximum transconductance from the transconductance versus gate voltage plot and a corresponding gate voltage that provides the maximum transconductance. The test engine 311 may determine a threshold voltage for the DUT 320 from the maximum transconductance gate voltage by employing substantially similar mechanisms as described herein above with respect to graph 100 and/or 200.

After determining the maximum transconductance for the DUT 320, the test engine 311 may determine a SSW for the DUT 320 according to the maximum transconductance, for example, by centering the SSW at about the maximum transconductance gate voltage. The test engine 311 may store the SSW in memory and apply the SSW for a next threshold voltage test. For example, the test engine 311 may perform a threshold voltage test on a next die (e.g., next DUT 320) on the wafer by sweeping the third voltage source 313 in the SSW and determining a threshold voltage for the next die by employing substantially similar mechanisms as described herein above with respect to graph 200.

Figures 4, 7:
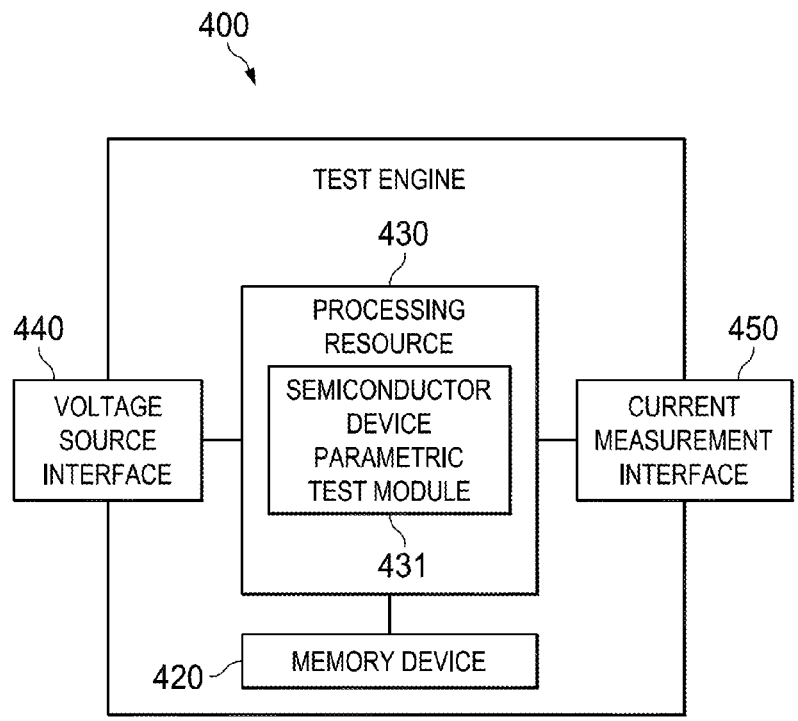
FIG. 4 shows a block diagram of a SSW threshold voltage test engine in accordance with various embodiments.
FIG. 7 is a table comparing threshold voltage measurements taken from a full sweep threshold voltage test and a SSW threshold voltage test in accordance with various embodiments.

FIG. 4 shows a block diagram of threshold voltage extraction test engine 400 in accordance with various embodiments. The test engine 400 may be substantially similar to test engine 311. The test engine 400 may comprise a processing resource 430, a memory device 420, a voltage source interface 440, and a current measurement interface 450. The processing resource 430 may be implemented as one or more general purpose processors. The processing resource 430 may comprise a semiconductor device parametric test module 431 stored in internal non-transitory memory in the processing resource 430 to permit the processing resource 430 to implement methods 500 and/or 600, described more fully below. In an alternative embodiment, the semiconductor device parametric test module 431 may be implemented as instructions stored in the memory device 420, which may be executed by the processing resource 430. The memory device 420 may comprise a cache for temporarily storing content, for example, a random access memory (RAM). Additionally, the memory device 420 may comprise a long-term storage for storing content relatively longer, for example, a read only memory (ROM). For instance, the cache and the long-term storage may include dynamic random access memories (DRAMs), solid-state drives (SSDs), hard disks, or combinations thereof. The voltage source interface 440 may be any physical link configured to communicate with one or more voltage sources (e.g., test source/monitor unit 312 and/or voltage sources 313). For example, the processing resource 430 may send voltage control commands to the voltage sources via the voltage source interface 440. The current measurement interface 450 may be any physical link configured to communicate with a current measuring instrument (e.g., test source/monitor unit 312 and/or current monitor 314). For example, the processing resource 430 may receive current measurements from the current measuring instrument via the current measurement interface 450.

Figure 5:
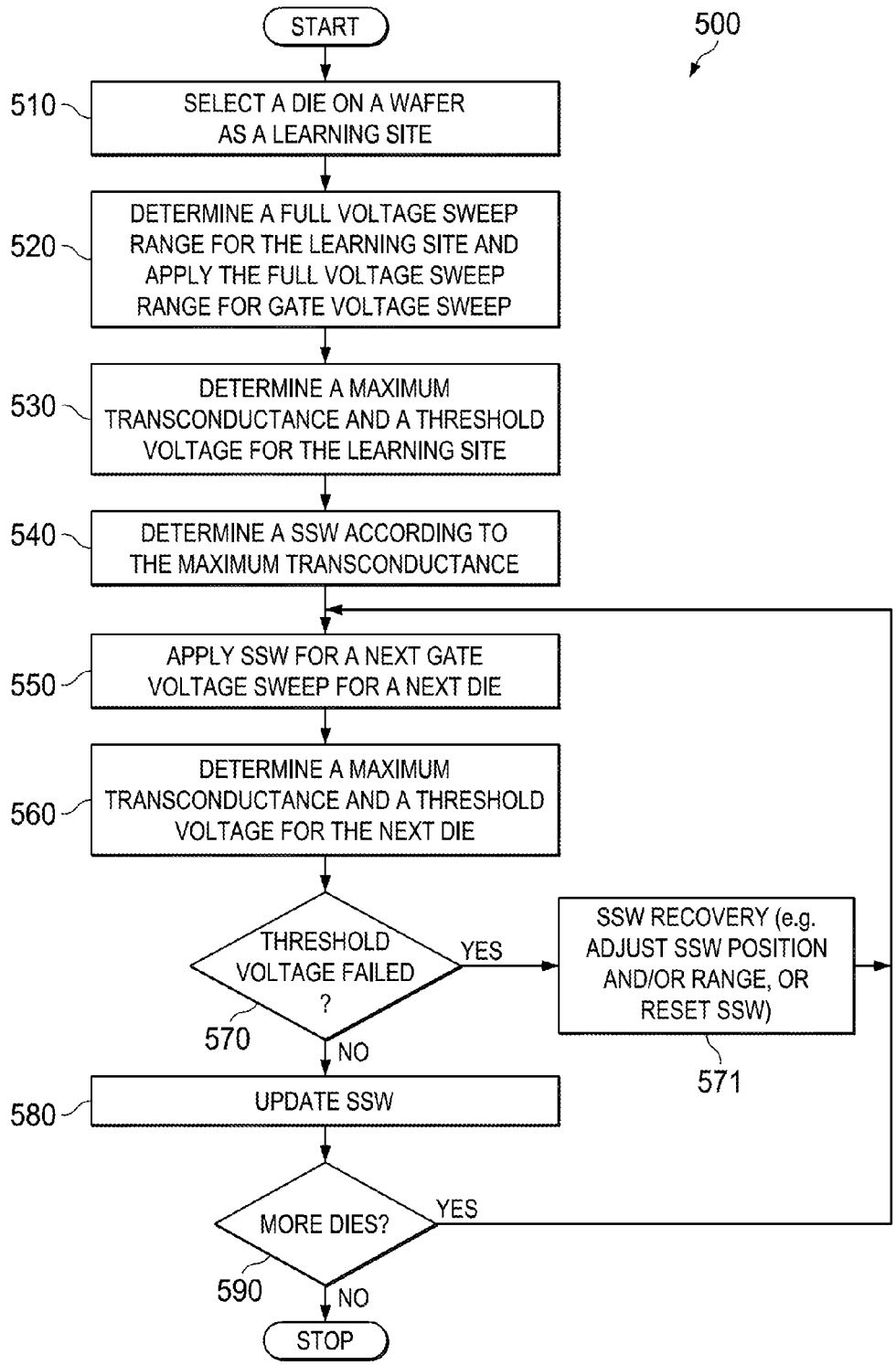
FIG. 5 shows a flowchart of a method for performing a SSW threshold voltage test in accordance with various embodiments.

FIG. 5 shows a flowchart of a method 500 for performing a SSW threshold voltage test in accordance with various embodiments. Method 500 may be implemented by a test engine (e.g., test engines 311 and/or 400) in a test set up substantially similar to the threshold voltage test system 300. Method 500 may be employed for extracting threshold voltages for a plurality of transistor devices or any other semiconductor components fabricated on a semiconductor wafer. For example, the transistor device may be a MOSFET device comprising a gate, a source, a drain, and a substrate. The operations depicted in FIG. 5 may be performed in the order shown or in any other suitable order.

Method 500 may begin with selecting a die on the semiconductor wafer as a learning site as shown in step 510. The learning site may be any site on the semiconductor wafer. At step 520, method 500 may determine a full voltage sweep range for the learning site according to an input gate voltage range (e.g., between a minimum input gate voltage $V_{GS\_min}$ and a maximum input gate voltage $V_{GS\_max}$) and may apply the full voltage sweep range for a gate voltage sweep. At step 530, method 500 may determine a maximum transconductance $G_{M\_max}$ and a threshold voltage $V_T$ for the learning site.

After determining the maximum transconductance $G_{M\_max}$ for the learning site, at step 540, method 500 may determine a SSW according to the maximum transconductance $G_{M\_max}$. For example, method 500 may position the SSW such that the SSW may be centered at about a gate voltage $V_{Gs\_Gmax}$ that provides the maximum transconductance $G_{M\_max}$ for the learning site and may configure SSW with a range substantially smaller (e.g., a window size of about 0.6 V) than the full voltage sweep range. For example, method 500 may account for process variations, measurement variations, etc. when selecting the SSW range. It should be noted that the position and/or the range of the SSW may be alternatively configured as determined by a person of ordinary skill in the art to provide the same functionalities.

After determining the SSW, at step 550, method 500 may apply the SSW for a next gate voltage sweep for a next die. At step 560, method 500 may determine a maximum transconductance $G_{M\_max}$ and a threshold voltage $V_T$ for a next die on the wafer. At step 570, method 500 may determine whether the threshold voltage $V_T$ extraction is successful. If the threshold voltage $V_T$ extraction is successful, method 500 may proceed to step 580. At step 580, method 500 may update the SSW according to the maximum transconductance $G_{M\_max}$ determined at step 560.

After the SSW is updated, at step 590, method 500 may check whether all the dies on the wafer are tested for threshold voltage. If there are more dies on the wafer, method 500 may repeat the loop of steps 550 to 590.

If the threshold voltage $V_T$ extraction fails at step 570, method 500 may proceed to step 571. At step 571, method 500 may perform a SSW recovery. For example, method 500 may adjust the position of the SSW and/or the range of the SSW and may return to step 550. In some embodiments, if method 500 continues to fail to determine a threshold voltage $V_T$ for the die, for example, after multiple SSW adjustments (e.g., step 571), method 500 may reset the SSW by performing a full sweep threshold voltage test and repeat the SSW determination (e.g., steps 520 to 540). It should be noted that method 500 may be repeated for another wafer (e.g., storing SSW in memory), where the SSW determined for a last die on a current wafer may be applied to a first die on a next wafer.

In method 500, the steps 510 to 540 may be referred to as a SSW learning phase, the steps in the loop of steps 550 to 590 may be referred to as a SSW application phase, and the step 571 may be referred to as a SSW recovery phase. It should be noted that method 500 may be suitable for other electrical characterization parametric test that employs a voltage sweep and/or current sweep.

Figure 6:
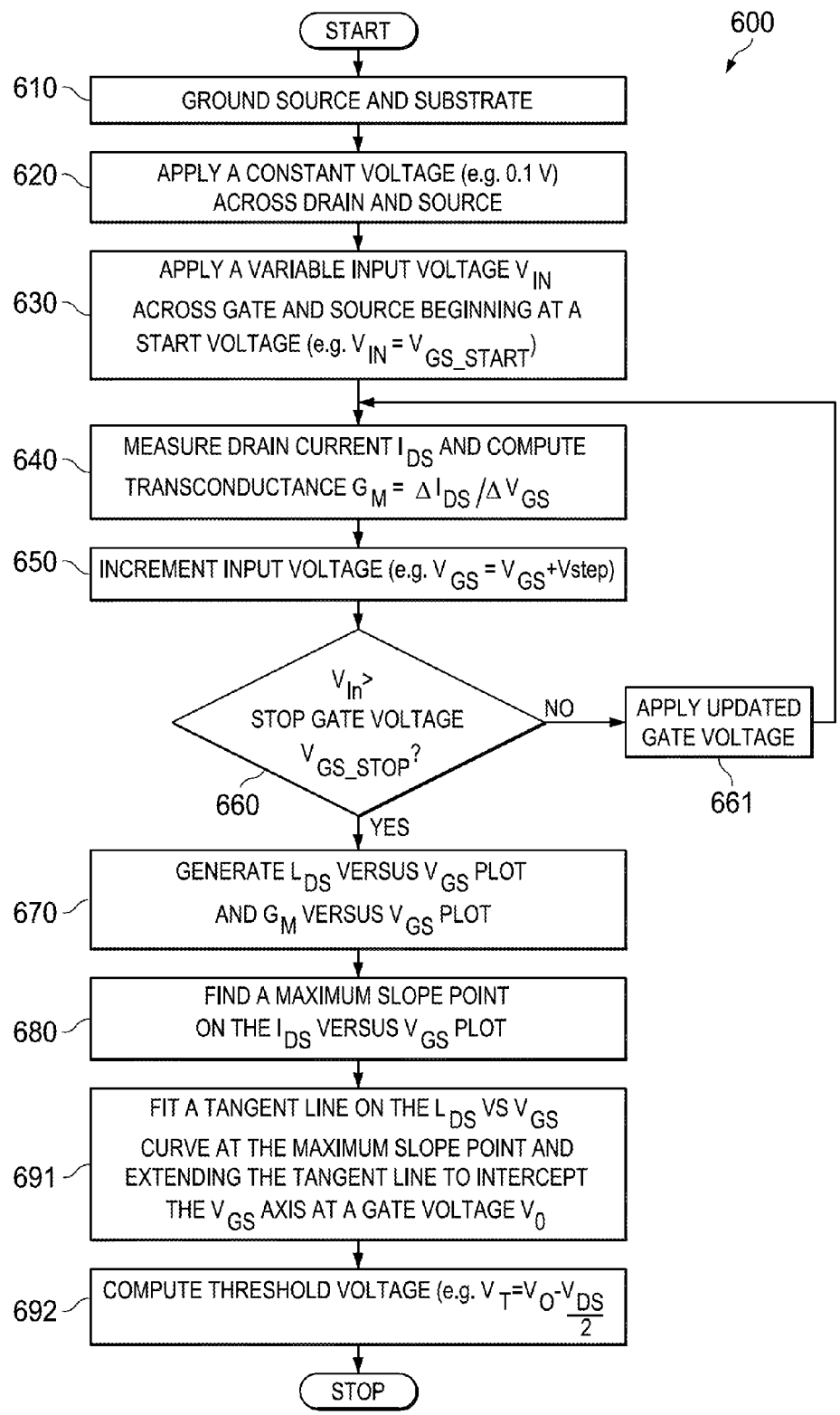
FIG. 6 shows a flowchart of a method for extracting a maximum transconductance and a threshold voltage in a SSW threshold voltage test in accordance with various embodiments.

FIG. 6 shows a flowchart of a method 600 for extracting a maximum transconductance and a threshold voltage in a SSW threshold voltage test in accordance with various embodiments. The operations depicted in FIG. 6 may be performed in the order shown or in any other suitable order. Method 600 may be implemented on a test engine (e.g., test engine 311 and/or 400) in a test set up substantially similar to the threshold voltage test system 300. Method 600 may be employed for extracting threshold voltages for a transistor device, such as a MOSFET device comprising a source, a drain, a gate, and a substrate. Method 600 may be performed after determining a start voltage $V_{GS\_start}$ and a stop voltage $V_{Gs\_stop}$ for a gate voltage sweep. For example, method 600 may correspond to steps 540 (e.g., minimum gate voltage and a pre-determined stop gate voltage in a full voltage sweep range) and/or 560 (e.g., minimum gate voltage and maximum gate voltage in a SSW range) of method 500. Method 600 may begin with grounding the source and the substrate of the device at step 610. At step 620, method 600 may apply a constant voltage (e.g., bias voltage of about 0.1 V) across the drain and the source $V_{DS}$ of the device.

At step 630, method 600 may apply a variable input voltage $V_{in}$ across the gate and the source (e.g., gate voltage $V_{GS}$) of the device beginning at the starting voltage $V_{GS\_start}$. At step 640, method 600 may measure drain current $I_{DS}$ across the drain and the source and compute transconductance $G_M$ according to equation (1) described herein above.

At step 650, method 600 may increment the input variable voltage $V_{in}$ by a step increment. At step 660, method 600 may determine whether the input variable voltage $V_{in}$ reaches the stop voltage $V_{GS\_stop}$. If the input variable voltage $V_{in}$ is less than the stop voltage $V_{GS\_stop}$, method 600 may proceed to step 661 to apply the updated voltage across the gate and the source and repeat the loop of steps 640 to 660.

If the input variable voltage $V_{in}$ reaches the stop voltage at step 660, method 600 may proceed to step 670. At step 670, method 600 may generate a plot (e.g., curve 110 and/or 210) of drain current $I_{DS}$ (e.g., from step 640) as a function of gate voltage $V_{GS}$ and a plot (e.g., curve 120 and/or 220) of transconductance $G_M$ (e.g., from step 640) as a function of gate voltage $V_{GS}$.

After generating the plots, at step 680, method 600 may find a maximum slope point on the $I_{DS}$ versus $V_{GS}$ plot. For example, method 600 may search for a peak (e.g., point 121 and/or 221) of the $G_M$ versus $V_{GS}$ plot and projecting a line from the peak towards the $I_{DS}$ versus $V_{GS}$ plot, where the point at which the projected line intercepts the $I_{DS}$ versus $V_{GS}$ plot may be the maximum slope point (e.g., point 111 and/or 211). At step 691, method 600 may fit a line (e.g., line 130 and/or 230) tangential to the maximum slope point to intercept the gate voltage $V_{GS}$ axis (e.g., x-axis) at a gate voltage $V_0$ (e.g., point 131 and/or 231). At step 692, method 600 may determine a threshold voltage $V_T$ from the gate voltage $V_0$ by employing equation (2) described herein above.

FIG. 7 is a table 700 comparing threshold voltage measurements taken from a full sweep threshold voltage test and a SSW threshold voltage test in accordance with various embodiments. In table 700, column 710 shows the type of components under test. Some examples of components may include NMOS, laterally diffused MOS (LDMOS), drain extended MOS, low threshold voltage PMOS. Column 720 shows the type of threshold voltage measurements, which may be a linear threshold voltage or a saturated threshold voltage. Column 730 shows threshold voltages in units of V measured from a full sweep threshold voltage test substantially similar to mechanisms described in graph 100. Column 740 shows threshold voltages units of Vs measured from a SSW threshold voltage test substantially similar to mechanisms described in graph 200 and/or methods 500 and/or 600. Column 750 shows the difference between threshold voltages measured from the full sweep threshold voltage test and the SSW threshold voltage test in units of millivolts (mV). As shown in column 750, the SSW threshold voltage test may provide threshold voltages substantially close (e.g., about 0.1 mV or less) to the full sweep threshold voltage test.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 7 percent, . . . , 70 percent, 71 percent, 72 percent, . . . , 97 percent, 96 percent, 97 percent, 98 percent, 99 percent, or 100 percent. Moreover, any numerical range defined by two R numbers as defined in the above is also specifically disclosed. Unless otherwise stated, the term "about" means ±10% of the subsequent number. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for performing a semiconductor parametric test at a test engine, comprising:
   performing a full voltage sweep for a first component on a first semiconductor wafer to determine a first value of an electrical characterization parameter for the first component, wherein the full voltage sweep comprises a range between about a minimum input voltage level of the first component and about a pre-determined stop voltage level of the first component;
   determining a smart sensing window (SSW) for a plurality of subsequent components on the first semiconductor wafer according to the first value, wherein the SSW comprises a range comprising a portion of the full voltage sweep range;
   performing a partial voltage sweep in the SSW for each of the subsequent components to determine a second value of the electrical characterization parameter for each of the subsequent semiconductor components; and
   adapting the SSW for at least some of the subsequent components.

2. The method of claim 1, wherein the first component and the subsequent components, each comprises a source, a drain, and a gate, and wherein the electrical characterization parameter comprises a gate voltage level across the gate and the source.

3. The method of claim 2, wherein performing the full voltage sweep on the first component comprises:
   applying the full voltage sweep across the gate and the source of the first component in a number of gate voltage levels in the full voltage sweep range;

measuring drain current between the drain and the source of the first component for each gate voltage level in the full voltage sweep range;
computing a transconductance for the first component from the measured drain current for each gate voltage level in the full voltage sweep range; and
searching for a maximum transconductance over the full voltage sweep range, wherein the first value corresponds to a gate voltage level that provides the maximum transconductance for the first component.

4. The method of claim 3, wherein the SSW comprises a plurality of gate voltage levels near the first value.

5. The method of claim 4, wherein the second value corresponds to a threshold voltage, and wherein performing the partial voltage sweep comprises:
applying the partial voltage sweep across the gate and the source of each subsequent component in a number of gate voltage levels in the SSW range;
measuring drain current between the drain and the source of each subsequent component for each gate voltage level in the SSW range;
generating a curve for the drain current as a function of the gate voltage levels in the SSW range for each subsequent component;
determining a point on the curve at which a line tangential to the point comprises a maximum slope for the curve;
extending the tangential line to intercept a gate voltage level axis at a third value; and
computing the second value from the third value.

6. The method of claim 1, wherein determining the SSW comprises positioning the SSW such that the SSW range is centered at about the first value.

7. The method of claim 1, wherein adapting the SSW comprises:
adjusting a position of the SSW according to the second value; and
applying the adjusted SSW position for a next subsequent component.

8. The method of claim 1, wherein adapting the SSW comprises:
adjusting a width of the SSW according to the second value; and
applying the adjusted SSW width for a next subsequent component.

9. The method of claim 1 further comprising:
adjusting the SSW when the second value is not found for a first of the subsequent components; and
performing the full voltage sweep for the first subsequent component to determine another SSW.

10. The method of claim 1 further comprising:
recording the SSW; and
performing the partial voltage sweep in the SSW to determine a third value of the electrical characterization parameter for a component on a second semiconductor wafer.

11. The method of claim 1, wherein the component comprises a metal oxide semiconductor field effect transistor (MOSFET) device.

12. A non-transitory, computer-readable storage device comprising computer executable instructions that, when executed by a test engine, cause the test engine to:
determine a smart sensing window (SSW) for a voltage sweep, wherein to determine the SSW, the instructions further cause the test engine to:
send a first command to increment a voltage source in first increments spanning a full input voltage range of a first component on a semiconductor wafer;
read first current measurements of the first component, wherein the current measurements correspond to the first increments;
compute a first value associated with an electrical characterization parameter for the first component from the first current measurements; and
determine a range for the SSW according to the first value such that the SSW range comprises a portion of the full voltage range near the first value;
send a second command to increment the voltage source in second increments spanning the SSW range;
read second current measurements of a second component on the semiconductor wafer, wherein the second current measurements correspond to the second increments; and
compute a second value associated with the electrical characterization parameter for the second component according to the second current measurements.

13. The computer-storage readable device of claim 12, wherein the first component and the second component, each comprises a transistor device comprising a source, a drain, and a gate, wherein the electrical characterization parameter comprises a gate voltage level across the gate and the source, wherein the first value corresponds to a gate voltage level that provides a maximum transconductance for the first component, and wherein the second value corresponds to a threshold voltage of the second component.

14. The computer-storage readable device of claim 12, wherein to determine the SSW range, the instructions further cause the test engine to position the SSW such that the SSW is centered at about the first value.

15. The computer-storage readable device of claim 12, wherein the instructions further cause the test engine to:
adjust the SSW range according to the second value; and
apply the adjusted SSW to determine a third value associated with the electrical characterization parameter of a third component on the semiconductor wafer.

16. The computer-storage readable device of claim 12, wherein the instructions further cause the test engine to:
adjust the SSW range when computing the second value for the second component fails to produce a valid value for the second value; and
repeat the determining of the SSW on the second component.

17. An apparatus, comprising:
a first interface configured to communicate with an input voltage source that couples to a plurality of transistors on a first semiconductor wafer, wherein each transistor comprises a gate, a source, and a drain;
a second interface configured to communicate with a current measuring instrument that couples to the transistors; and
a test engine coupled to the first interface and the second interface and configured to:
configure, via the first interface, the voltage source to connect between the gate and the source of a first of the transistors and sweep in a full voltage range in voltage increments, wherein the full voltage range is between about a minimum gate voltage of the transistors and about a maximum gate voltage of the transistors;
read, via the second interface, drain current measurements of the first transistor, wherein the current measurements correspond to the voltage increments;
compute transconductances for the first transistor from the current measurements, wherein the transconductances correspond to the voltage increments;

determine a first voltage level that provides a maximum transconductance for the first transistor;

determine a smart sensing window (SSW) range according to the first voltage level, wherein the SSW range comprises a portion of the full voltage range near the first voltage level;

configure, via the first interface, the voltage source to connect between the gate and the source of a second of the transistors and sweep in the SSW range; and determine a threshold voltage for the second transistor in the SSW range.

18. The apparatus of claim 17, wherein the test engine is further configured to:

adjust the SSW according to the threshold voltage; and determine a threshold voltage for a third of the transistors in the adjusted SSW.

19. The apparatus of claim 17 further comprises a memory coupled to the test engine and configured to store the SSW range, wherein the test engine is further configured to determine a threshold voltage for a third of a plurality of transistors on a second semiconductor wafer in the SSW range.

20. The apparatus of claim 17, wherein the test engine is further configured to adjust a span of the SSW range and a position of the SSW when determining the threshold voltage for the second transistor fails to find the threshold voltage.

* * * * *